(12) United States Patent
Miller et al.

(10) Patent No.: US 7,075,242 B2
(45) Date of Patent: Jul. 11, 2006

(54) COLOR OLED DISPLAY SYSTEM HAVING IMPROVED PERFORMANCE

(75) Inventors: Michael E. Miller, Honeoye Falls, NY (US); Ronald S. Cok, Rochester, NY (US); Andrew D. Arnold, Hilton, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/812,786

(22) Filed: Mar. 29, 2004

(65) Prior Publication Data

US 2004/0178743 A1 Sep. 16, 2004

Related U.S. Application Data

(63) Continuation-in-part of application No. 10/387,953, filed on Mar. 13, 2003, and a continuation-in-part of application No. 10/320,195, filed on Dec. 16, 2002.

(51) Int. Cl.
*G09G 3/10* (2006.01)

(52) U.S. Cl. .............................. 315/169.3; 315/169.1; 315/292; 315/297; 345/204; 345/690; 345/83; 345/84

(58) Field of Classification Search ............. 315/169.1, 315/169.3, 169.2, 291, 292, 297, 307, 149, 315/308; 345/83, 84, 204, 207, 690, 76, 345/77
See application file for complete search history.

(56) References Cited

U.S. PATENT DOCUMENTS

| | | | |
|---|---|---|---|
| 3,813,686 A | 5/1974 | Mierwinski | 348/603 |
| 4,800,375 A | 1/1989 | Silverstein et al. | 345/694 |
| 5,233,385 A | 8/1993 | Sampsell | 355/35 |
| 5,526,016 A | 6/1996 | Nakagiri et al. | 345/111 |
| 5,563,621 A | 10/1996 | Silsby | 345/43 |
| 5,638,084 A | 6/1997 | Kalt | 345/31 |
| 6,075,514 A | 6/2000 | Ryan | 345/601 |
| 6,133,692 A | 10/2000 | Xu et al. | 313/506 |

(Continued)

FOREIGN PATENT DOCUMENTS

EP 830032 3/2002

(Continued)

OTHER PUBLICATIONS

Klompenhouwer et al.; "Subpixel Image Scaling For Color Matrix Displays"; SID 02 Digest; pp. 176-179.

*Primary Examiner*—Haissa Philogene
(74) *Attorney, Agent, or Firm*—Andrew J. Anderson (57) ABSTRACT

An OLED display system includes an OLED display including an array of light emitting pixels, each pixel having a plurality of OLEDs for emitting different colors of light specifying a gamut and including at least one additional OLED within the gamut defined by the other OLEDs and wherein one of the OLEDs has a power efficiency or lifetime different from the power efficiency or lifetime of at least one of the other OLEDs; a control signal; and a display driver for receiving a color display signal representing a relative luminance and color to be produced for each pixel of the display and generating a converted color display signal for driving the OLEDs in the display at the relative luminance and color, wherein the display driver is responsive to the control signal for controlling the in-gamut mixing ratio of the OLEDs to reduce power consumption or increase lifetime of at least one of the OLEDs.

17 Claims, 6 Drawing Sheets

U.S. PATENT DOCUMENTS

| | | |
|---|---|---|
| 6,262,710 B1 | 7/2001 | Smith .................. 345/589 |
| 6,320,325 B1 * | 11/2001 | Cok et al. ............. 315/169.3 |
| 6,329,758 B1 * | 12/2001 | Salam ................. 315/169.2 |
| 6,388,644 B1 | 5/2002 | DeZwart et al. ........... 345/60 |
| 6,411,306 B1 | 6/2002 | Miller et al. ............ 345/690 |
| 6,483,245 B1 | 11/2002 | Weindorf et al. ........... 315/82 |
| 6,498,952 B1 | 12/2002 | Imani et al. .............. 607/37 |
| 6,747,618 B1 * | 6/2004 | Arnold et al. ............ 345/77 |
| 2002/0015110 A1 | 2/2002 | Elliott ................. 348/589 |
| 2002/0024618 A1 | 2/2002 | Imai .................. 348/743 |
| 2002/0186214 A1 | 12/2002 | Siwinski ............... 345/212 |
| 2002/0196208 A1 | 12/2002 | Nano et al. .............. 345/55 |
| 2003/0103058 A1 | 6/2003 | Elliott et al. ............ 345/589 |
| 2004/0051724 A1 | 3/2004 | Elliott et al. ............ 345/694 |
| 2004/0113875 A1 | 6/2004 | Miller et al. ............. 345/82 |
| 2004/0178973 A1 | 9/2004 | Miller et al. ............. 345/82 |
| 2004/0178974 A1 | 9/2004 | Miller et al. ............. 345/82 |
| 2004/0195963 A1 | 10/2004 | Choi et al. ............. 313/504 |
| 2004/0222999 A1 | 11/2004 | Choi et al. ............. 345/589 |

FOREIGN PATENT DOCUMENTS

| | | |
|---|---|---|
| JP | 10/254386 | 9/1998 |
| JP | 2000/200061 | 7/2000 |
| WO | 00/11728 | 3/2000 |
| WO | 00/70400 | 11/2000 |
| WO | 01/99195 | 12/2001 |

* cited by examiner

COLOR OLED DISPLAY SYSTEM HAVING IMPROVED PERFORMANCE

CROSS-REFERENCE TO RELATED APPLICATIONS

This is a continuation-in-part of U.S. Ser. No. 10/320,195, filed Dec. 16, 2002, and a continuation-in-part of U.S. Ser. No. 10/387,953, filed Mar. 13, 2003, the disclosures of which are incorporated by reference herein in their entireties.

FIELD OF THE INVENTION

The present invention relates to organic light emitting diode (OLED), full-color display devices and, more particularly, to OLED color displays with improved power efficiency or extended display lifetime.

BACKGROUND OF THE INVENTION

Color, digital image display devices are well known and are based upon a variety of technologies such as cathode ray tubes, liquid crystal and solid-state light emitters such as Organic Light Emitting Diodes (OLEDs). In a common OLED color display device a pixel includes red, green, and blue colored OLEDs. By combining the illumination from each of these three OLEDs in an additive color system, a full-color display having a wide variety of colors can be achieved.

OLEDs may be used to generate color directly using organic materials that are doped to emit energy in desired portions of the electromagnetic spectrum. However, the known red and blue emissive materials are not particularly power efficient. In fact, broad bandwidth (white appearing) materials are known that have power efficiencies that are high enough by comparison to narrow bandwidth materials to produce a comparably power efficient OLED display by placing color filters over a broad bandwidth emissive material. Therefore, it is known in the art to produce OLED displays by building a display using an array of white-emitting OLEDs and placing color filters over the OLEDs to achieve red, green and blue light emitting elements in each pixel.

While power efficiency is always desirable, it is particularly desirable in portable applications because an inefficient display limits the time the device can be used before the power source is recharged. In fact, for certain applications the rate of power consumption may be more important than any other display characteristic with the exception of visibility. For this reason, under certain circumstances the end user may wish to reduce the power consumption of a display by making tradeoffs in display performance, which may have the effect of reducing the visibility or perceived quality of the display under various conditions.

Portable applications may require the display to be used in locations with high ambient illumination. It is known in the art, that an emissive display must be capable of providing higher luminance levels to be seen under high ambient illumination conditions than under lower ambient illumination conditions, and it is also known that these higher luminance levels are necessary to produce both adequate luminance contrast as well as a luminance range that is near the adapted luminance range of the observer. See "The ABC's of Automatic Brightness Control", R. Merrifield and L. D. Silverstein, SID 88 Digest, 1988, pp. 178–180. For this reason, it is known to provide a user with a control to change the luminance of the display in response to changes in ambient illumination conditions. It is also known to automatically adjust the luminance of the display. For example, U.S. Pat. No. 3,813,686, issued May 28, 1974 to Mierzwinski, discusses a control circuit for a cathode ray tube that automatically increases the luminance and chrominance signals to produce a more appealing and useful image under high ambient viewing conditions.

In portable applications, such an automatic circuit allows the display to provide a lower luminance and thus reduced power consumption under low ambient illumination conditions and a higher luminance and thus improved visibility under high ambient illumination conditions. Many enhancements have been discussed for this basic method of adjusting the luminance of a display in response to changes in ambient illumination. For example, U.S. Pat. No. 6,411,306, issued Jun. 25, 2002 to Miller, et al., discusses a method of adjustment for a portable device in which the luminance and contrast of the display are modified in a way which is consistent with human adaptation, that is the luminance of the display is adjusted quickly and in a progressive fashion as the display is moved from a low to a high ambient illuminance environment but the luminance of the display device is adjusted more slowly as the display is moved from a high to a low ambient illuminance environment. However, any previous method that has been used to adjust the luminance of the display has required proportionally more power with increases in display luminance.

Figure 1:
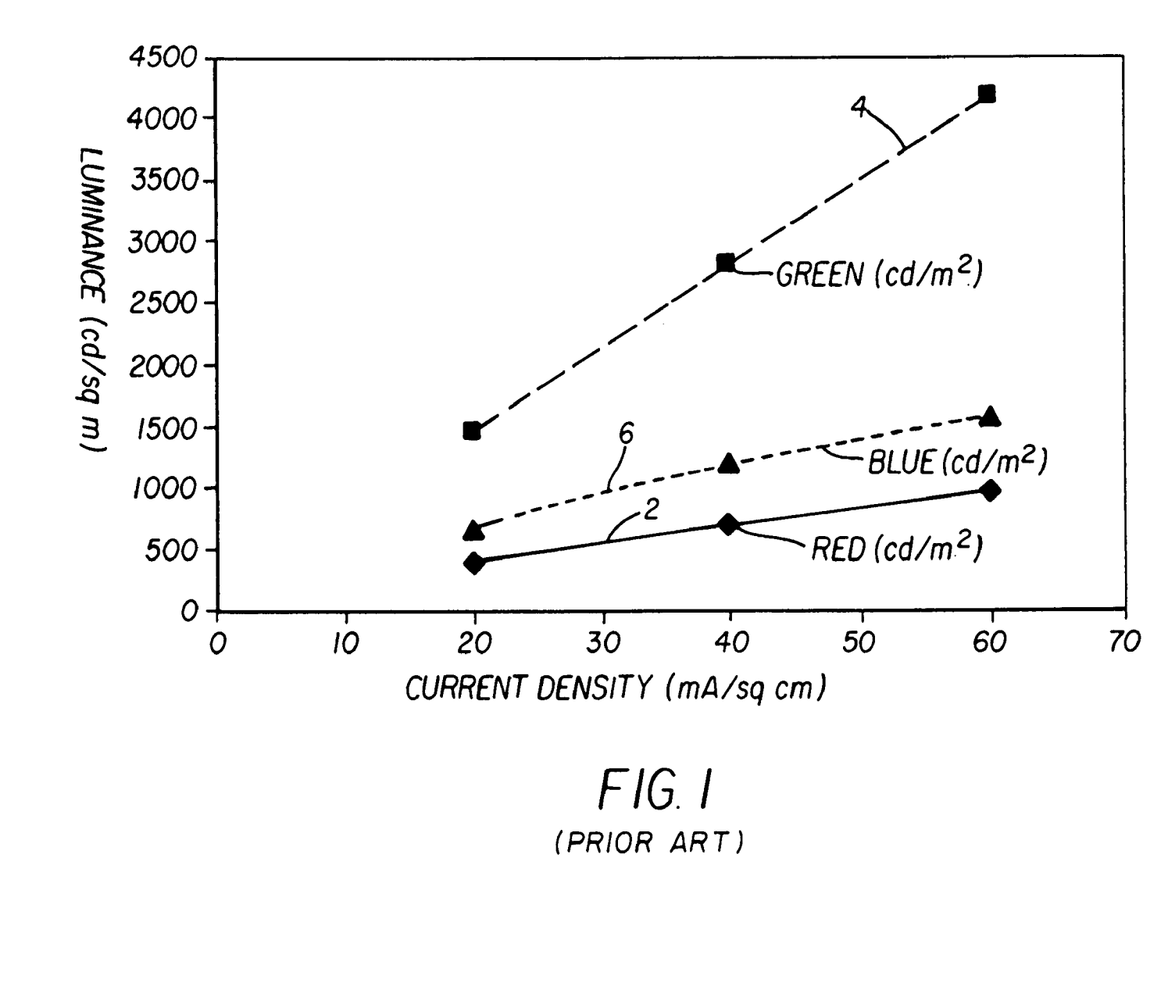
FIG. 1 is a graph showing the relationship of current density to luminance for a typical OLED.

In a typical, prior-art OLED displays, it is known that the luminance of the red, green, and blue OLEDs increase as current density delivered to the OLED is increased. The transfer function from current density to luminance typically behaves according to a linear function as shown in FIG. 1 as known in the prior art. FIG. 1 shows current density to luminance transfer functions for typical red 2, green 4 and blue 6 OLEDs. Therefore, to increase the luminance of the display, one must increase the current delivered to an OLED with a given area. To maintain a color-balanced display, the current must be adjusted differentially to the three OLEDs to maintain the desired ratio of red:green:blue luminance.

Figure 2:
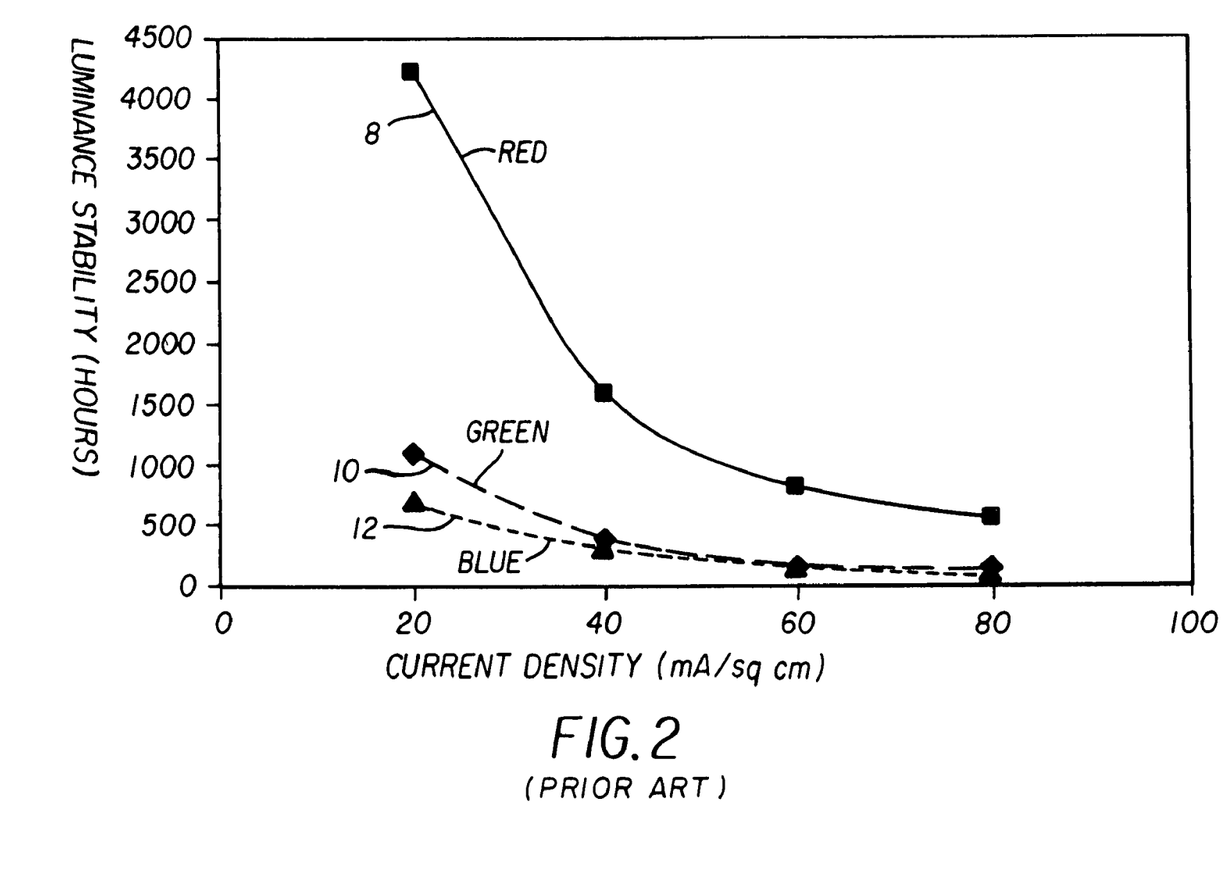
FIG. 2 is a graph showing the relationship of current density to the luminance stability over time of a typical OLED.

Unfortunately, increasing the current density used to drive an OLED not only increases the power required to drive the OLED but also reduces the lifetime of the OLED. FIG. 2 shows typical functions that describe the time required for an OLED to lose half of its luminance as a function of the current density used to drive the OLED. These functions describe the luminance stability over time of the OLEDs as a function of current density. FIG. 2 shows the luminance stability over time of a typical red 8, green 10 and blue 12 OLED. Therefore, increasing the luminance of an OLED display not only increases the power needed to drive the OLED display device but can significantly reduce the lifetime of the OLED display device.

The overall lifetime of a display may be decreased through changes in relative color efficiency as well as decreasing luminance output. If one OLED material used to produce a particular color of light degrades more rapidly than other materials that produce other colors of light, for example through heavier use, the particular light output from the material will decrease relative to the other colors of light. This differential color output change will change the color balance of the display and is much more noticeable than a decrease in overall luminance. While this decrease in luminance and light output of the particular color can be accommodated by increasing the brightness of the particular color, such a solution increases the rate of aging, the power usage, and exacerbates the change in relative color efficiency in the display.

There is, therefore, a need to improve power efficiency and/or improve display lifetime of an OLED. There is a further need for a full-color OLED display device having improved power efficiency and lifetime without necessarily decreasing the luminance of the display.

SUMMARY OF THE INVENTION

An OLED display system includes an OLED display including an array of light emitting pixels, each pixel having a plurality of OLEDs for emitting different colors of light specifying a gamut and including at least one additional OLED within the gamut defined by the other OLEDs and wherein one of the OLEDs has a power efficiency or lifetime different from the power efficiency or lifetime of at least one of the other OLEDs; a control signal; and a display driver for receiving a color display signal representing a relative luminance and color to be produced for each pixel of the display and generating a converted color display signal for driving the OLEDs in the display at the relative luminance and color, wherein the display driver is responsive to the control signal for controlling the in-gamut mixing ratio of the OLEDs to reduce power consumption or increase lifetime of at least one of the OLEDs.

ADVANTAGES

The advantages of this invention include an OLED display system that allows improved power efficiency and display lifetime without decreasing the luminance or color gamut of the display.

DETAILED DESCRIPTION OF THE INVENTION

The present invention is directed to a color OLED display system comprising a color OLED display, a control signal, and a controller for driving the color OLED display device in response to the control signal. More particularly, the present invention is directed to display systems that include a full-color display device having four or more light-emitting elements emitting light of different colors. The display system comprises an OLED display including an array of light emitting pixels, each pixel having a plurality of OLEDs for emitting different colors of light specifying a gamut and an additional in-gamut light-emitting OLED having a power efficiency higher than the power efficiency of at least one of the other gamut-defining OLEDs; a control signal; and a display driver for receiving a color display signal representing a relative luminance and color to be produced for each pixel of the display and generating a converted color display signal for driving the OLEDs in the display, the display driver being responsive to the control signal for controlling the in-gamut mixing ratio of light produced by the in-gamut OLEDs such that the power efficiency of the display may be increased and/or the rate of degradation of the OLED display may be decreased. In this invention, the display driver associated with the display device includes a signal processor that converts a standard three-color image signal to drive signals that drive the emissive OLEDs in a way that is dependent on the control signal.

This conversion is accomplished such that the power usage is minimized or display lifetime maximized by modifying the in-gamut mixing ratio in response to some control signal. The term "in-gamut mixing ratio" refers to the ratio of light produced by the in-gamut OLED to the white light produced by the combined gamut-defining OLEDs. This in-gamut mixing ratio is variable for any non-saturated color displayed on the display. For example, in the extreme case of a black and white scene depicted on the display, the white light may be created by the in-gamut element alone with no contribution by the gamut-defining OLEDs (presuming that the white point of the display matches the white light emitted by the in-gamut element), or by a combination of the gamut-defining OLEDs with no contribution from the in-gamut OLED, or by any combination of the two extremes. The ratio of light produced by the in-gamut OLED to-the white light produced by the combined gamut-defining OLEDs is the in-gamut mixing ratio. In the example above, if all of the white light is produced by the in-gamut OLED (and none of the white light is produced by the gamut-defining OLEDs), the in-gamut mixing ratio is defined to be 100%. If none of the white light is produced by the in-gamut OLED (and all of the white light is produced by the gamut-defining OLEDs), the in-gamut mixing ratio is 0%. If the white point of the display does not match the color of the light emitted by the in-gamut OLED, an additional color component must be added by one or more of the gamut-defining OLEDs to the light emitted by the in-gamut OLED to produce the desired white light. Note that changes in the in-gamut mixing ratio do not affect the overall brightness of the display or the color saturation of the light.

If a display displays a saturated color, no white light is emitted and the in-gamut OLED is not used. When the in-gamut OLED is more efficient than the gamut-defining OLEDs, setting the in-gamut mixing ratio to 100% minimizes the power usage. However, studies conducted by applicant demonstrate that the use of an in-gamut OLED can deleteriously affect the perceived image quality for some types of scenes. Moreover, as is known in the art, the rate of degradation of OLED materials is different for different materials. The use of the materials is dependent on scene content so a display designer is forced to optimize the display by varying the OLED element materials, pixel element sizes, and in-gamut mixing ratio. This optimization will depend on the scene content to be displayed on the display and by usage patterns of the display. The present invention optimizes the display by modifying the in-gamut mixing ratio in response to usage patterns, environmental constraints, and scene content.

The control signal will typically be dependent upon user settings, a state of the display system, the image content to be displayed, the power available to the display system, and/or a measurement of ambient illumination. When ambient illumination is sensed the display system may additionally-adjust the luminance of the display to maintain display visibility under the appropriate ambient illumination conditions. By allowing the conversion to be dependent on user settings, the user is given the ability to trade image quality as affected by the in-gamut mixing ratio for power efficiency. This conversion may additionally be dependent upon the luminance of the display. The display system may change the conversion to provide higher utilization of OLEDs with higher power efficiency and/or luminance stability over time for other luminance values. By doing this, conditions that may demand excessive power, or brightness, or may cause an unacceptable degradation of the display device may be avoided by providing adjusting in-gamut mixing ratios.

Figures 3, 4:
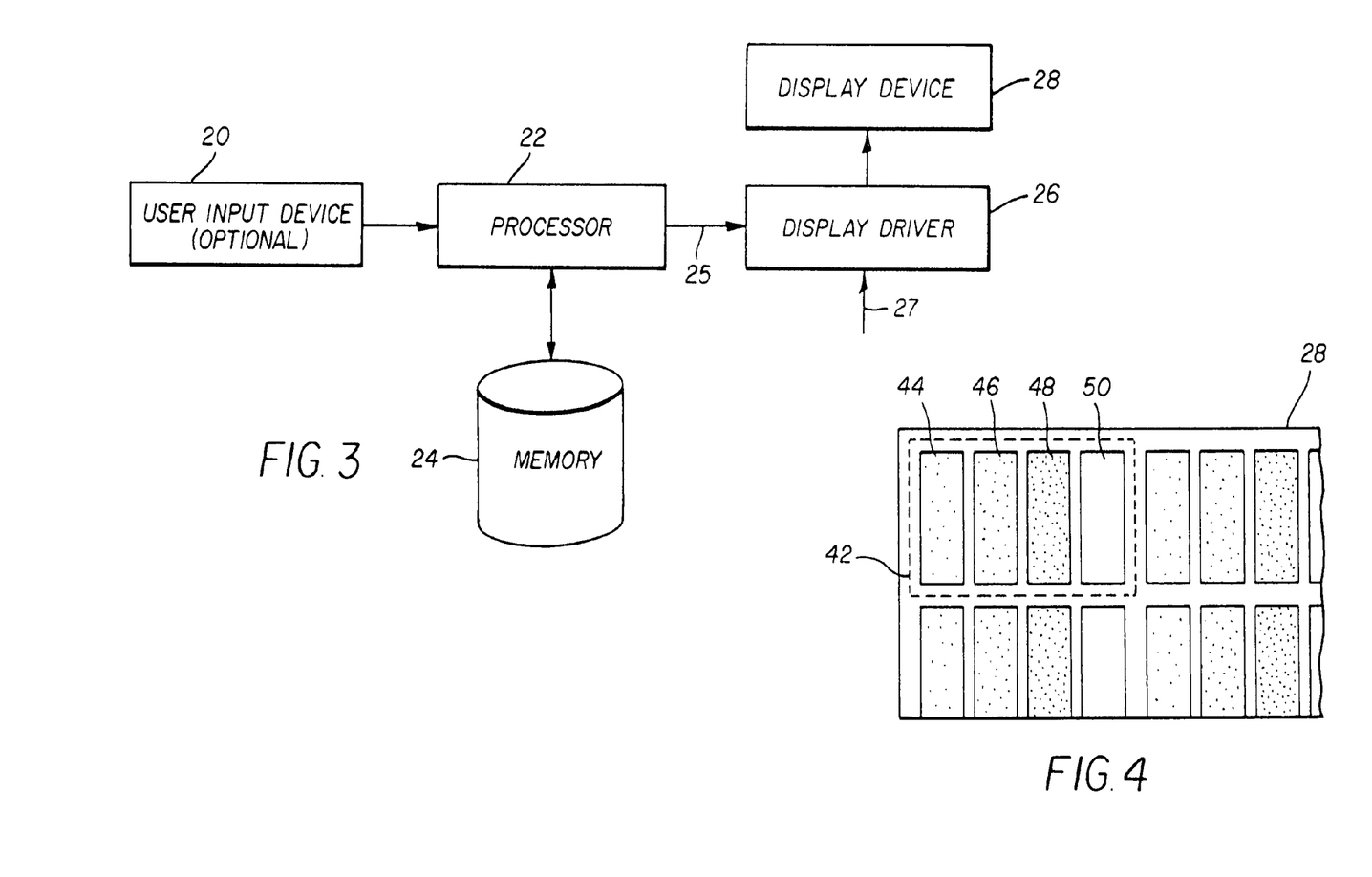
FIG. 3 is a diagram illustrating the components of the display system according to one embodiment of the present invention.
FIG. 4 is a schematic diagram illustrating the layout of a series of OLEDs on a display device according to one embodiment of the present invention.

An embodiment of this invention is shown in FIGS. 3 and 4. Referring to FIG. 3, the system includes an input device 20, processor 22, memory 24, display driver 26 and display device 28. The input device 20 may include any traditional input device including a joystick, trackball, mouse, rotating dial, switch, button or graphic user interface that may be used to select among two or more options from a series of user options. The processor 22 is any, or combination of any, digital or analog, general-purpose or custom controller(s) capable of performing the logic and calculation steps necessary to perform the steps of this invention. The processor 22 may be any computing device suitable to an application and may, or may not, be combined into a single component with the display driver 26. The memory 24 ideally includes non-volatile, writable memory that can be used to store user selections including EPROMS, EEPROMS, memory cards, or magnetic or optical discs.

The display driver 26 is one or more analog or digital signal processors or controllers capable of receiving a standard three-color image signal and converting this signal to a power-saving or lifetime-preserving drive signal compatible with the display device of the present invention. The display driver 26 will convert a 3-color signal to a 4-color signal. This display driver is additionally capable of receiving a control signal 25 from the processor 22 or a control signal 27 from an external source (not shown) and adjusting the conversion process in response to this control signal. Either or both control signals 25 or 27 may be employed. The processor 22 may supply the control signal 25 in response to, e.g., information regarding the age of the display, the charge of the power source, the content of the information to be displayed on the display 28, or the ambient illumination. Alternatively these signals may be supplied through an external control signal, 27 from an ambient illumination sensor (for example a photosensor) or a device for measuring or recording the age of the display, or the charge of a power source.

The display device 28 is an OLED display device having an array of pixels, each pixel having OLEDs for providing three or more primary colors that define the gamut of the display device, and an additional in-gamut OLED that is more efficient than at least one of the other gamut-defining OLEDs. An appropriate OLED display device has been discussed in a co-pending application, U.S. Ser. No. 10/320,195 filed Dec. 16, 2002 by Miller, et al. which is incorporated herein by reference. A display device with such a pixel arrangement is shown in FIG. 4.

Figure 5:
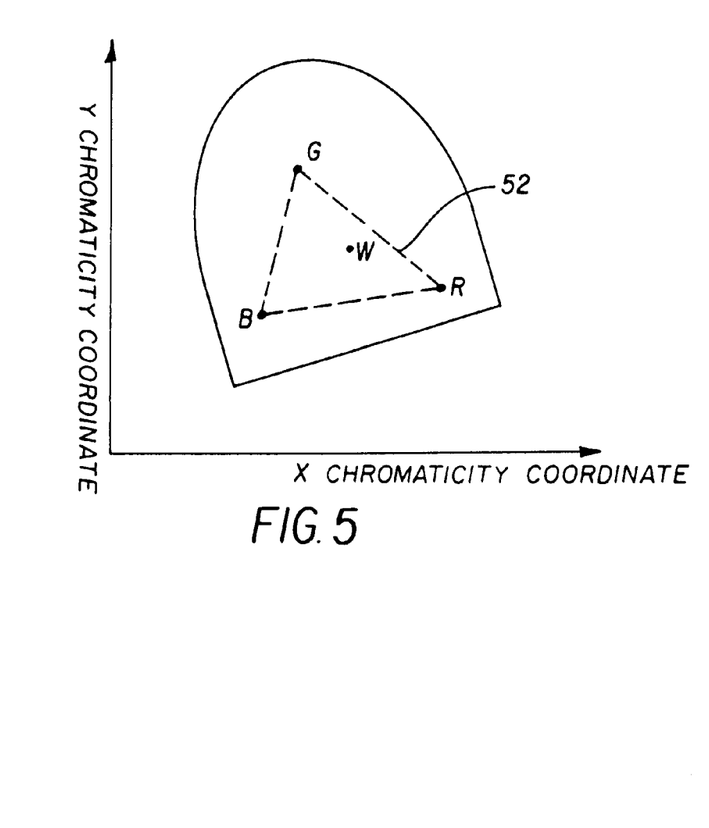
FIG. 5 is a CIE chromaticity diagram showing gamut formed chromaticity coordinates of red, green and blue OLEDs and a chromaticity coordinate of a white OLED inside the gamut.

FIG. 4 shows a display device 28, that is composed of a number of pixels 42. Each pixel 42 in this display device 28 is composed of four OLEDs. Three OLEDs that emit red 44, green 46, and blue 48 light define the gamut of the display device. An additional OLED 50 emits light that is substantially white in color and has a chromaticity coordinate that is inside the gamut defined by the chromaticity coordinates of the red 44, green 46 and blue 48 OLEDs. FIG. 5 is a standard CIE chromaticity diagram showing a color gamut 52 formed by the chromaticity coordinates of the red, green and blue (R,G,B) OLEDs and the chromaticity coordinate of a white (W) OLED that is inside the gamut 52.

Referring to FIG. 5, the three-color OLED (for example red, green, and blue) employs an additional in-gamut emitter, for example white wherein the in-gamut emitter is more efficient than the others, and preferably has a maximum luminance equal to the combined white luminance of the colored emitters. Such an OLED may save power by providing a variable in-gamut mixing ratio as follows. For example, assume an OLED display driven at 10 volts and 20 mA/cm$^2$ (200 mW) produces a light output from the white light emitter of 180 cd/m$^2$, a light output from the green light emitter of 120 cd/m$^2$, a light output from the red light emitter of 60 cd/m$^2$, and a light output from the blue light emitter of 40 cd/m$^2$. In this example, a normalized device size of 1 cm$^2$ is used. As noted above, there are an indefinite number of ways to produce a white color by combining the color elements with the white element. For example, white can be produced by using the white emitter alone without any contribution from the color emitters. Alternatively, white can be produced from a combination of the color emitters without any contribution from the white emitter. Methods of computing a conversion from a red, green, and blue color signal to a red, green, blue, and white signal are described in copending application U.S. Ser. No. 10/607,374 by Murdoch et al., which is hereby incorporated by reference.

In this example, a white color of 360 cd/m$^2$ may be produced using 0.4 W with an in-gamut mixing ratio of 100%. In contrast, by using an in-gamut mixing ratio of 0%, 1.2 W are required. As a second example, consider a pink color combining equal portions of both white and red. In this second example, a pink color of 360 cd/m$^2$ may be produced using 0.8 W with an in-gamut mixing ratio of 100% or may be produced using 1.2 W with an in-gamut mixing ratio of 0%. Efficiencies between the two extremes may be gained by using in-gamut mixing ratios less than 100% and greater than 0%. Hence, the use of an increased in-gamut mixing ratio reduces power usage. Reduced power usage implies reduced current through the light emissive materials. Hence, an increased in-gamut mixing ratio may reduce current densities as well, increasing the display lifetime.

For example, assuming that the emissive areas for the white and red OLED emitters are the same, the use of a 0% in-gamut mixing ratio results in a current of 80 mA/cm$^2$ in the red OLED to produce the pink color described above. If an in-gamut mixing ratio of 100% is used, a current of 60 mA cm$^2$ in the red is required, thus reducing the maximum current through the red emitter.

In practical use, if a display is to maintain a given resolution, it is possible that the use of a four-color pixel may reduce the actual light emitting area of the individual elements. While this will not change the total power used to produce a given brightness, it can increase the current density and decrease the display lifetime. Therefore, for any specific application it is important to compare any changes in the emissive area of a pixel to the changes in power usage to optimize the display lifetime and power usage. In particular, it may be useful to reduce the maximum current density in any one OLED element to minimize material degradation. It may also be useful to minimize differences in current density through the different color OLED emitters (weighted by expected lifetime of the materials) to minimize differential color aging.

The present invention describes a way to reduce power usage and improve lifetime for a display by employing a variable in-gamut mixing ratio. However, as noted above, an increase in the in-gamut mixing ratio in a display may reduce the perceived image quality of a display. Hence, it is important to apply the present invention in applications where an increase in in-gamut mixing ratio does not significantly reduce the perceived image quality of the display or in situations where any decrease in perceived image quality is outweighed by the advantages gained in power usage or improved lifetime of the display. For example, applicants have demonstrated through tests that for textual applications (such as may be found in personal digital assistants or computers with a graphic user interface) a higher in-gamut mixing ratio decreases the readability of text, whereas in more image-based applications, no such loss in perceived quality is experienced. Reference is also made to copending application U.S. Ser. No. 10/703,748 by Primerano et al., which is directed to a method for transforming three color input signals to four or more output signals for color display, with preserved edge information, which is herein incorporated by reference. The present invention may be applied to provide the maximum reduced power for imaging applications without compromising perceived image quality whereas for textual applications somewhat less power saving may be preferred.

Referring back to FIG. 3, a variety of sources for the control signal may be employed. One such control signal may be produced by a signal representing the ambient illumination. In operation, the display driver 26 or processor 25 may respond to a signal representing the level of light in the ambient illumination. Under bright conditions, the in-gamut mixing ratio of the display may be maximized to preserve power. Under dim conditions, the in-gamut mixing ratio of the display may be reduced. Preferably, the variation in in-gamut mixing ratio is accomplished gradually as the ambient light illumination increases so that any changes are imperceptible to a viewer. It is possible to limit the in-gamut mixing ratios to some maximum (or minimum) value to optimize overall performance. It is also possible to provide a function, for example a linear or exponential function relating the in-gamut mixing ratio and the ambient illumination to determine the in-gamut mixing ratio desired at a particular ambient illumination level. Such functions may have limits, or damping constants, to limit the rate of change of the in-gamut mixing ratio to reduce the perceptibility of any in-gamut mixing ratio changes.

In an alternative embodiment, it is possible to use the state of the power supply to dictate the in-gamut mixing ratio. In a situation where the power supply is depleted, aggressive power saving measures may be employed to reduce power usage. In this case, the in-gamut mixing ratio may be maximized. When the power supply is fully charged, the in-gamut mixing ratio may be reduced. As before, a gradual decrease in in-gamut mixing ratio may be employed to avoid perceptible changes over time.

In another alternative embodiment, it is possible to use the information shown on a display to dictate the in-gamut mixing ratio. In a situation where a graphic interface having a textual component is employed on a display, the in-gamut mixing ratio may be reduced. If images are shown on a display, the in-gamut mixing ratio may be increased. However, it is also the case that graphic interfaces tend to use graphic elements for long times at specific locations, possibly causing the light-emissive materials at those display locations to degrade more rapidly than in other locations. The present invention may be employed to reduce both the current and the range of current densities in those locations. Therefore, the rate of degradation of the emissive materials and color differential degradation may be reduced.

In yet another alternative embodiment, it is possible to use the age of the display to dictate the in-gamut mixing ratio. Typical OLED materials in use today degrade most rapidly when they are first used. After some period of time, the rate of degradation is reduced. In this situation, it may be helpful to reduce color differential aging at the beginning of the display lifetime by employing the present invention to reduce the maximum current density in the OLED elements and reduce the differences in current densities in the different OLED elements.

In is also possible to allow a display user to directly control the in-gamut mixing ratio through a user interface. More likely, a power control mechanism may be employed by the user and the present invention may be employed along with other power saving measures such as reducing display brightness, to reduce power usage or improve display lifetime at the user's discretion. The user can then make tradeoffs between system attributes such as power usage, display visibility, and image quality.

Although a variety of embodiments employing the present invention are described herein, it is understood that other applications may require improved lifetime or reduced power usage for a display. Hence, the application of the present invention is not limited to the embodiments described herein.

Figure 6:
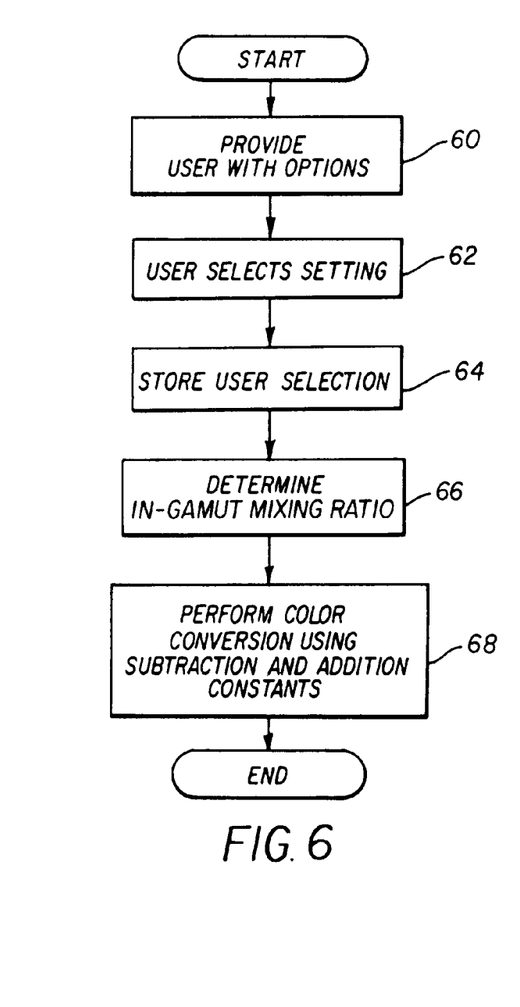
FIG. 6 is a flow chart illustrating the general process employed by the system to determine an appropriate subtraction and addition constants.
Figure 7:
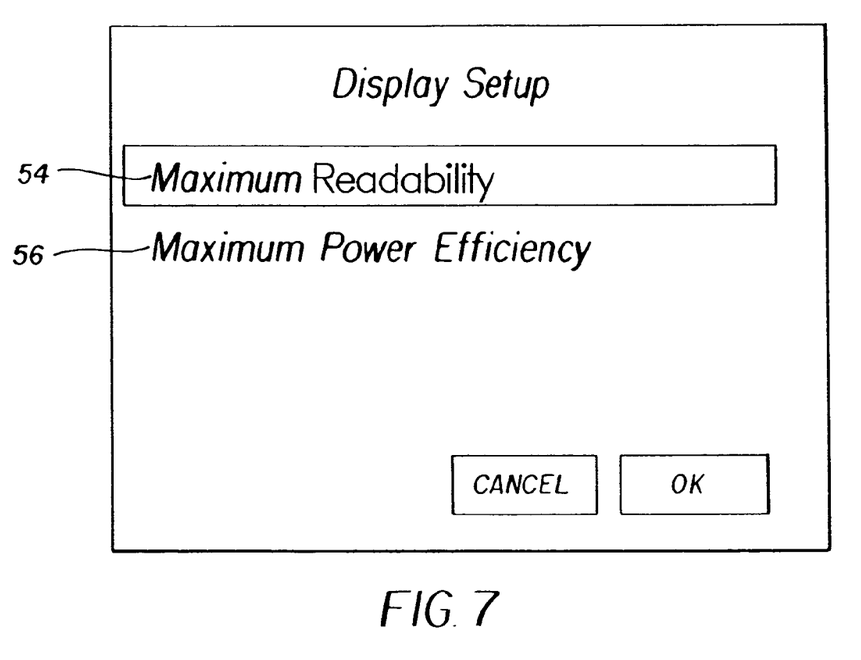
FIG. 7 is a diagram illustrating a graphic user interface screen for obtaining user input.

FIG. 6 shows a process that may be employed to practice this invention. A user is provided 60 with the option to select among different settings for the display device, allowing her to tradeoff power efficiency for in-gamut OLED utilization. To accomplish this, a menu of possible alternatives may be displayed to the user as shown in FIG. 7. The alternatives can include, for example, "maximum readability" 54 reducing the in-gamut mixing ratio, or "maximum power efficiency" 56 allowing the maximum use of the white OLEDs. Alternatively, a "slider" can be provided in the graphic user interface to allow the user to select a continuous level of trade off between image quality and power usage. This user interface allows the user to select 62 among options that include different combinations of image quality and power efficiency. When the user selects 62 their preferred setup, the processor 22 stores 64 the user selection into memory 24 for future reference. The processor 22 then determines 66 the appropriate ratio of luminance required from the one or more additional OLEDs to the luminance required from the OLEDs of the display device. For example, this ratio may be determined 66 by referencing a look-up table from memory 24. The processor 22 or display driver 26 then uses these values to perform 68 a conversion from a standard three-color image signal to drive signals that drive the OLEDs.

It should also be noted that this conversion process may be further modified to not only reduce power but to help maintain display lifetime. As shown in FIG. 2, OLED luminance stability, when defined as the number of hours required for an OLED to reach half of its initial luminance, is highly dependent upon the drive current. Therefore, if it is determined that the display must perform for a minimum number of hours, e.g., 500, one can use a graph such as FIG. 2 to determine the maximum current density that the OLED can be driven to meet this criteria. Using this criteria, one can see that the blue light emitting OLED can only be driven at a current density of 20 mA/cm$^2$ while the green and red light emitting OLEDs can be driven at current densities around 35 and 80 mA/cm$^2$, respectively. White emitting materials are known that perform very well using this criteria and can be driven at or even well beyond 80 mA/cm$^2$ using this criteria. Using this value and a mathematical relationship relating current density to luminance of a display device, one can determine the maximum luminance that can be achieved for any color light emitting OLED that will not exceed the maximum current density for the appropriate OLED. Therefore, the maximum intensity may be limited and any additional light is produce by a white-light emitting OLED. In this way, the current density may be reduced for that one color. It should be noted that it is possible that the luminance required from the white-light emitting OLED may also reach a maximum value in which case this luminance may be redistributed to the color light emitting OLEDs using a similar approach.

By providing a conversion process, the user is able to modify the power usage of the display for a given display brightness by allocating the amount of luminance to be generated by the display away from less power efficient OLEDs and towards more power efficient OLEDs. Therefore, this invention allows the user to improve power efficiency.

It should be noted that; the changes in power efficiency by adjusting the in-gamut mixing ratio may be made intentionally by the user. However, as noted above, the same tradeoff may be initiated by other events. For example, the user interface may provide a control, such as a brightness control for the display. Alternatively, a system may be able to detect the power level of a battery, such that the display draws less power when the available battery power level reaches some threshold. The same tradeoff may further be made when the system detects lack of user interest or responsiveness. For example when a certain amount of time passes without user interaction, the system may begin to enter a power saving mode.

Figure 8:
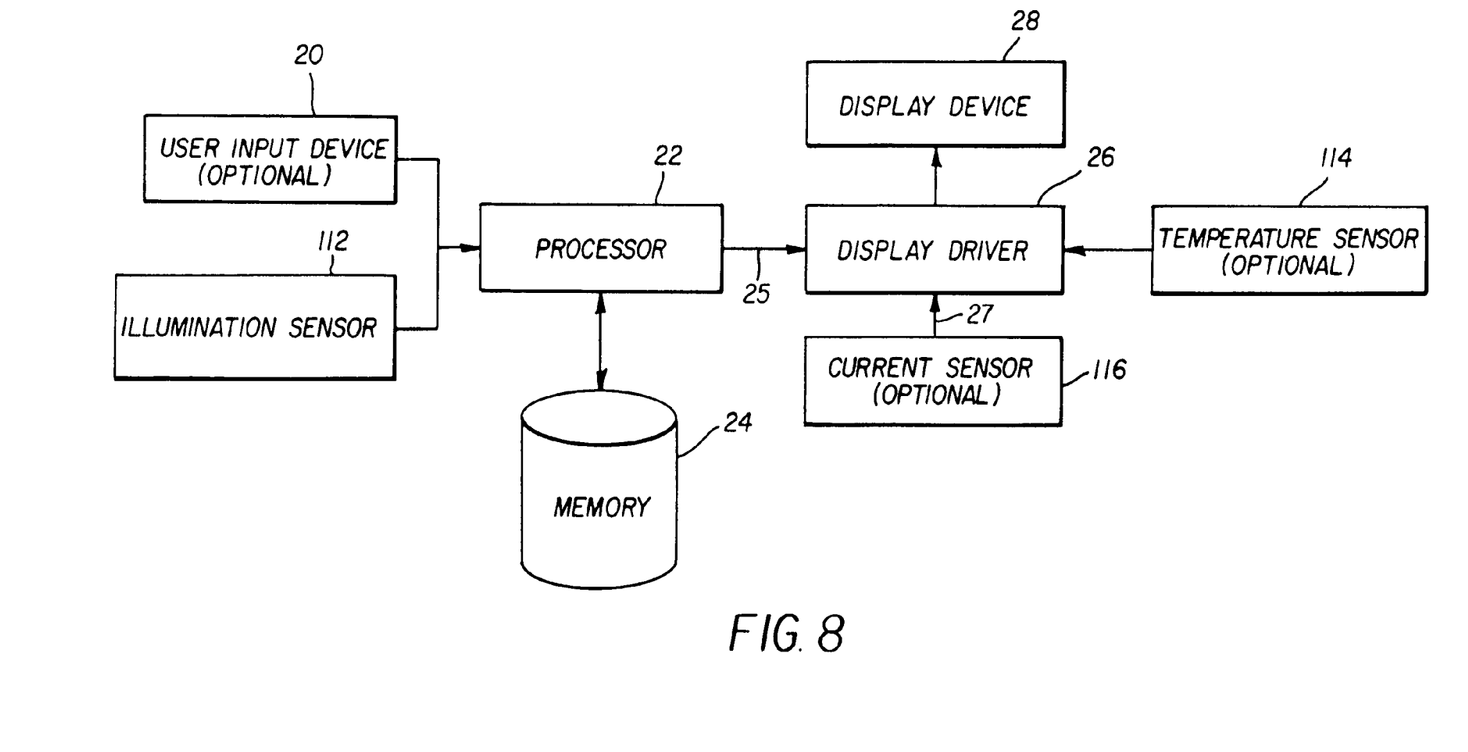
FIG. 8 is a diagram illustrating the components of the display system according to one embodiment of the present invention.

Referring to FIG. 8, the display system of the present invention may employ an automatic method for determining ambient illumination, adjusting the brightness of the display in response, and adjusting the in-gamut mixing ratio in response to the ambient illumination in a way that makes the adjustment appear at a slow enough rate that the change is, not readily apparent to the user, while at the same time improving the power efficiency of the display device and/or improving the lifetime of the display under high display luminance conditions. As shown in FIG. 3, the display system includes a processor 22, memory 24, display driver 26 and a display device 28. The system also includes a user input device 20, which is used to adjust a gain value for the display brightness as described below. Additionally the system may include an ambient illumination sensor 112 such as a photodiode or other sensor that is used to measure the amount of ambient illuminance in the environment that falls on or near the display. As discussed later, the system may also include other sensors, such as an optional temperature sensor 114 or current sensor 116. The temperature sensor 114 may be placed on the back of the display device and is used to measure the temperature of the display device. The current sensor 116 may be used to measure the current being drawn by the display device.

Control parameters can be changed gradually as the viewing environment of the display changes. Since the occurrence of dramatic changes in ambient illumination, content, power, and aging are rare and the rate at which they change is likely to be small, it is unlikely that individual changes in in-gamut mixing ratio will be large. Therefore, while the display may change in-gamut mixing ratio, especially, e.g., when moved between very low ambient illuminance and very high ambient illuminance environments, it is unlikely that the user will see this change. However, since the in-gamut mixing ratio will generally be increased with increases in display luminance, the power efficiency and lifetime of the OLEDs that compose the display will be improved.

It should be noted that similar continuous changes in in-gamut mixing ratio may be employed as a function of any other continuous control signal. These may include but are not limited to the available power in the power supply of the portable device, a manually determined display luminance value, the total current needed to drive the display device as sensed using the optional current sensor 116 or the temperature of the display device determined from a temperature sensor 118 placed in or near the display device.

It should be noted that while the particular embodiments discussed herein are discussed particularly for a display device having three OLEDs that define the gamut boundary of the display and one additional OLED that has a higher power efficiency and lifetime but has color coordinates that are within the gamut of the display device, these same concepts may be employed in a similar display device having more than three OLEDs that define the gamut. Additionally, these same concepts may apply to a display device having more than one additional OLED with a higher power efficiency.

It is important to note that any changes in image quality due to changes in in-gamut mixing ratio are dependent upon the pixel layout, that is the arrangement of the differently colored light emissive areas within a pixel. FIG. 4 illustrates a stripe pattern and the applicants have noted the image quality effects of this pattern as a function of the in-gamut mixing ratio. Alternative patterns are possible and will have different image quality attributes and different responses to varying in-gamut mixing ratios. In these alternative cases, the changes in in-gamut mixing ratio under various conditions and usage patterns may change. In some cases, an increase in in-gamut mixing ratio may be preferred. In other cases, a decrease in in-gamut mixing ratio may be preferred. For example, under bright ambient conditions the preferred in-gamut mixing ratio may be different from the preferred in-gamut mixing ratio in darker conditions.

The present invention may be employed in OLED display having different materials to emit different colors of light. Alternatively, the present invention may be employed with OLED displays having a single emitter for emitting a broadband light (for example, white) and color filters to produce the different colors of light. In this latter case, the present invention will not provide improved power savings but may be employed to reduce color differential aging in a display.

The present invention can be employed in most top- or bottom-emitting OLED device configurations. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 2 luminance transfer function for red OLED
4 luminance transfer function for green OLED
6 luminance transfer function for blue OLED
8 stability curve for red OLED
10 stability curve for green OLED
12 stability curve for blue OLED
20 input device
22 processor
24 memory
25 signal
26 display driver
27 signal
28 display device
42 pixel
44 red OLED
46 green OLED
48 blue OLED
50 white OLED
52 color gamut
54 maximum colorfulness selection
56 maximum power efficiency selection
60 provide user with option step
62 user selection step
64 store user selection in memory step
66 determine subtraction and addition constants step
68 perform conversion step
112 ambient illumination sensor
114 temperature sensor
116 current sensor

What is claimed is:

1. An OLED display system, comprising:
   a) an OLED display including an array of light emitting pixels, each pixel having a plurality of OLEDs for emitting different colors of light specifying a gamut and including at least one additional OLED within the gamut defined by the other OLEDs and wherein one of the OLEDs has a power efficiency or lifetime different from the power efficiency or lifetime of at least one of the other OLEDs;
   b) a control signal; and
   c) a display driver for receiving a color display signal representing a relative luminance and color to be produced for each pixel of the display and generating a converted color display signal for driving the OLEDs in the display at the relative luminance and color, wherein the display driver drives the OLEDs in the display with the converted color display signal to produce in-gamut colors using a combination of light from the in-gamut OLED and light from the gamut defining OLEDs in accordance with an in-gamut mixing ratio, and is responsive to the control signal for controlling the in-gamut mixing ratio of the OLEDs to reduce power consumption or increase lifetime of at least one of the OLEDs.

2. The OLED display system claimed in claim 1, wherein the control signal is dependent upon the image content of the color display signal, and wherein the display driver controls the in-gamut mixing ratio of the converted color display signal in proportion to the image content of the color display signal.

3. The OLED display system claimed in claim 1, wherein the control signal is dependent upon the age of the OLED display, and wherein the display driver controls the in-gamut mixing ratio of the converted color display signal in proportion to the age of the OLED display.

4. The OLED display system claimed in claim 1, further comprising a user interface control that allows a user to select a tradeoff between power usage and in-gamut mixing ratio of the OLED display.

5. The OLED display system claimed in claim 1, wherein the display driver limits the in-gamut mixing ratio of the OLED display within a range having some minimum and/or maximum value.

6. The OLED display system claimed in claim 1, wherein the OLED display includes OLEDs having materials that emit different colors of light including at least one of the group including red, green, blue, and white.

7. The OLED display system claimed in claim 1, wherein the OLED display includes OLEDs that emit white light and are overlaid with color filters.

8. The OLED display system claimed in claim 7, wherein the color filters include at least one of the group including red, green, and blue.

9. The OLED display system claimed in claim 1, wherein the in-gamut OLED emits white light.

10. The OLED display system claimed in claim 1, wherein the display driver further changes the in-gamut mixing ratio as a function of the brightness of the OLED display.

11. A method of driving an OLED display, comprising the steps of:
   a) providing an OLED display including an array of light emitting pixels, each pixel having a plurality of OLEDs for emitting different colors of light specifying a gamut and including at least one OLED within the gamut defined by the other OLEDs and wherein the power efficiency of the in-gamut OLED is higher than the power efficiency of at least one of the other OLEDs;
   b) generating a control signal;
   c) receiving a standard color display signal representing a relative luminance and color to be produced for each pixel of the OLED display and generating a converted color display signal for driving the OLEDs in the display to produce in-gamut colors using a combination of light from at least one in-gamut OLED and light from at least one of the gamut defining OLEDs in accordance with an in-gamut mixing ratio in response to the control signal to control the in-gamut mixing ratio of the display; and
   d) driving the OLED display with the converted color display signal.

12. The method claimed in claim 11, wherein the control signal is dependent upon the image content of the color display signal, and wherein the display driver controls the in-gamut mixing ratio of the converted color display signal in proportion to the image content of the color display signal.

13. The method claimed in claim 11, wherein the control signal is dependent upon the age of the OLED display, and wherein the display driver controls the in-gamut mixing ratio of the converted color display signal in proportion to the age of the OLED display.

14. The method claimed in claim 11, further comprising a user interface control and wherein the user interface control allows a user to select a tradeoff between power usage and in-gamut mixing ratio of the OLED display.

15. The method claimed in claim 11, wherein the display driver limits the range of the in-gamut mixing ratio of the OLED display within some minimum and/or maximum value.

16. The method claimed in claim 11, wherein the OLED display includes OLEDs having materials that emit different colors of light.

17. An OLED display system, comprising:
  a) an OLED display including an array of light emitting pixels, each pixel having a plurality of OLEDs for emitting different colors of light specifying a gamut and including at least one additional OLED within the gamut defined by the other OLEDs and wherein one of the OLEDs has a power efficiency or lifetime different from the power efficiency or lifetime of at least one of the other OLEDs;
  b) a control signal; and
  c) a display driver for receiving a color display signal representing a relative luminance and color to be produced for each pixel of the display and generating a converted color display signal for driving the OLEDs in the display at the relative luminance and color, wherein the display driver is responsive to the control signal for controlling the in-gamut mixing ratio of the OLEDs to reduce power consumption or increase lifetime of at least one of the OLEDs, and wherein the display driver limits the in-gamut mixing ratio of the OLED display within a range having some minimum and/or maximum value.

* * * * *